United States Patent
Usui et al.

(10) Patent No.: US 9,466,779 B2
(45) Date of Patent: Oct. 11, 2016

(54) PIEZOELECTRIC ACTUATOR AND METHOD OF MANUFACTURING PIEZOELECTRIC ACTUATOR

(71) Applicant: BROTHER KOGYO KABUSHIKI KAISHA, Nagoya-shi, Aichi-ken (JP)

(72) Inventors: Takamasa Usui, Nagoya (JP); Yasuhiro Sekiguchi, Nagoya (JP); Tomohiro Nodsu, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 149 days.

(21) Appl. No.: 14/331,448

(22) Filed: Jul. 15, 2014

(65) Prior Publication Data
US 2015/0048721 A1   Feb. 19, 2015

(30) Foreign Application Priority Data
Aug. 19, 2013 (JP) ................................ 2013-169771

(51) Int. Cl.
*H01L 41/047* (2006.01)
*B41J 2/14* (2006.01)
*H01L 41/09* (2006.01)

(52) U.S. Cl.
CPC .......... *H01L 41/047* (2013.01); *B41J 2/14233* (2013.01); *H01L 41/0973* (2013.01); *B41J 2002/14459* (2013.01); *B41J 2002/14475* (2013.01); *B41J 2002/14491* (2013.01); *B41J 2202/11* (2013.01); *B41J 2202/18* (2013.01); *B41J 2202/20* (2013.01); *Y10T 29/42* (2015.01)

(58) Field of Classification Search
CPC ............................................. B41J 2002/14217
USPC ...................... 310/363–366, 328; 347/70–72
See application file for complete search history.

(56) References Cited

U.S. PATENT DOCUMENTS

| | | | |
|---|---|---|---|
| 2005/0062807 A1* | 3/2005 | Ito ........................ | B41J 2/14209 347/72 |
| 2005/0248628 A1* | 11/2005 | Isono ................... | B41J 2/14209 347/71 |
| 2005/0270339 A1* | 12/2005 | Sugahara ............. | B41J 2/14233 347/68 |
| 2006/0170738 A1* | 8/2006 | Kato .................... | B41J 2/14233 347/72 |
| 2007/0182787 A1* | 8/2007 | Kubo ....................... | B41J 2/055 347/58 |
| 2009/0096844 A1* | 4/2009 | Kojima ................ | B41J 2/14274 347/72 |
| 2012/0186859 A1* | 7/2012 | Yamashita ............ | H05K 1/118 174/254 |

FOREIGN PATENT DOCUMENTS

| | | |
|---|---|---|
| JP | 2006-019460 | 1/2006 |
| JP | 2012-156185 | 8/2012 |

* cited by examiner

*Primary Examiner* — Jaydi San Martin
(74) *Attorney, Agent, or Firm* — Frommer Lawrence & Haug LLP

(57) ABSTRACT

A piezoelectric actuator includes one piezoelectric layer, a common electrode disposed on the lower surface of the piezoelectric layer and individual electrodes disposed on the upper surface of the piezoelectric layer. In the piezoelectric layer, a plurality of metal patterns arranged at regular intervals in the conveyance direction and in a direction orthogonal to the conveyance direction and overlapping with pressure chambers are provided substantially at the central part in the direction of the thickness. The metal patterns are not electrically continuous with each other and not electrically continuous with other parts. The metal patterns situated outermost in the conveyance direction are disposed so as to cross the edge of the pressure chamber. Some metal patterns overlap with the individual electrode and the other metal patterns do not overlap with the individual electrode.

11 Claims, 9 Drawing Sheets

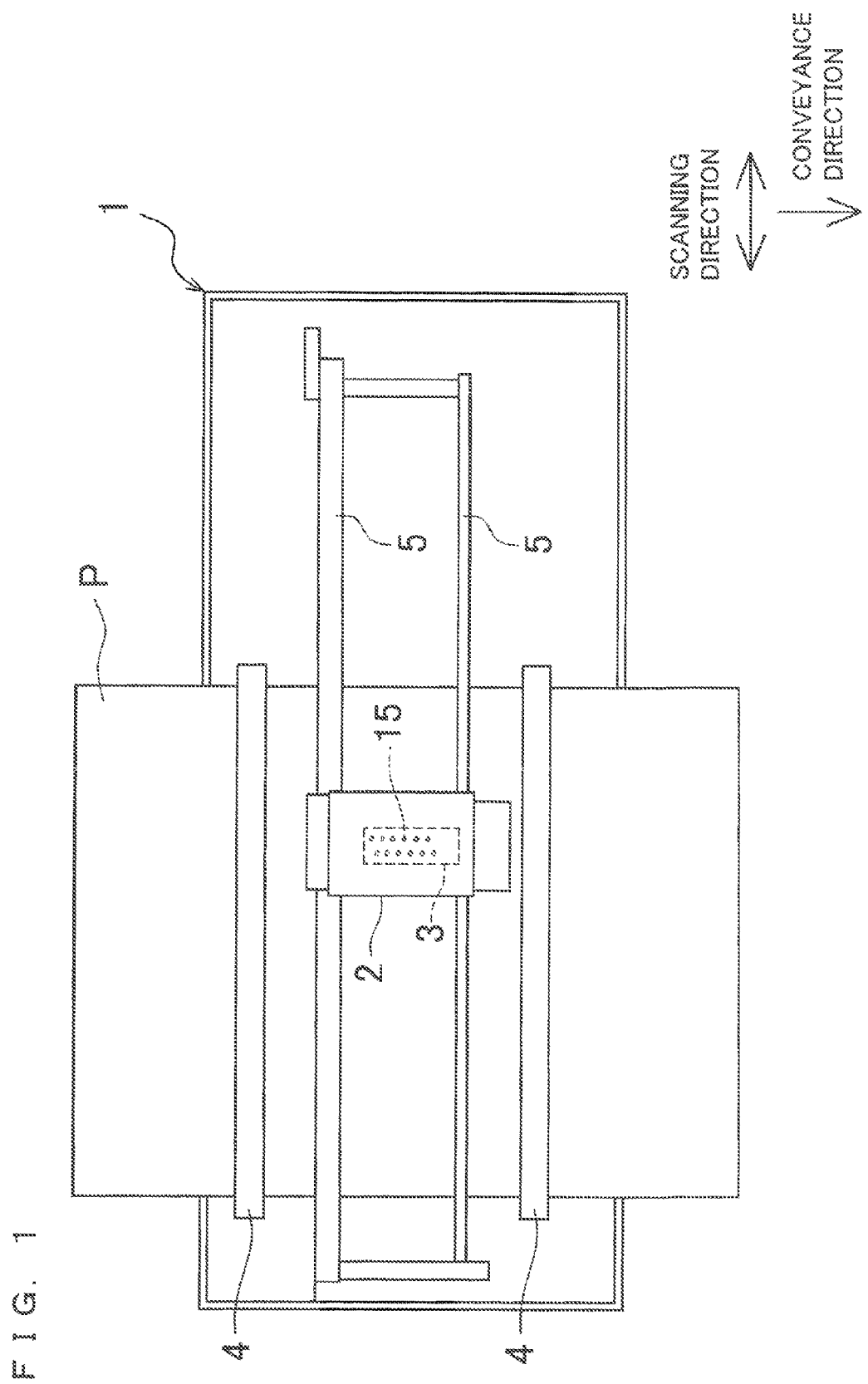
F I G. 1

CONVEYANCE DIRECTION

CONVEYANCE DIRECTION

PIEZOELECTRIC ACTUATOR AND METHOD OF MANUFACTURING PIEZOELECTRIC ACTUATOR

CROSS-REFERENCE TO RELATED APPLICATIONS

This non-provisional application claims priority under 35 U.S.C. §19(a) on Patent Application No. 2013-169771 filed in Japan on Aug. 19, 2013, the entire contents of which are hereby incorporated by reference.

TECHNICAL FIELD

The present invention relates to a piezoelectric actuator for applying a pressure to a liquid in a pressure chamber, and a method of manufacturing the piezoelectric actuator.

BACKGROUND

A piezoelectric actuator described in Japanese Patent Application Publication Laid-Open No, 2012-156185 is a piezoelectric actuator used for an inkjet head. This piezoelectric actuator is provided with two piezoelectric layers, a common electrode and a plurality of individual electrodes. The two piezoelectric layers are laminated with each other, and continuously extend over a plurality of pressure chambers. The common electrode extends between the two piezoelectric layers substantially over the entire area thereof, and is held at the ground potential. The individual electrodes are disposed on parts, overlapping with the pressure chambers, of the upper surface of the upper piezoelectric layer, respectively, and a driving signal is input thereto. The parts of the upper piezoelectric layer sandwiched between the individual electrodes and the common electrode are polarized along the direction of the thickness. When the driving signal is input to an individual electrode to induce a potential difference between the individual electrode and the common electrode, the part of the piezoelectric layer sandwiched between these electrodes contracts in the direction of the surface, so that the part of the two piezoelectric layers overlapping with the pressure chamber is deformed so as to be convex to the pressure chamber side as a whole. Consequently the volume of the pressure chamber decreases to increase the pressure on the ink in the pressure chamber, so that the ink is jetted from the nozzle connecting with the pressure chamber.

SUMMARY

In Japanese Unexamined Patent Application Publication No. 2019-156185, if the overall thickness of the piezoelectric actuator is decreased, the deformation of the parts of the piezoelectric actuator that overlap with the piezoelectric chambers when the potential difference is caused between the individual electrodes and the common electrode becomes large. However, if the thickness of the piezoelectric actuator is decreased, there is a possibility that the piezoelectric layers break at times such as when the piezoelectric actuator is handled and when the piezoelectric actuator and the flow channel unit are bonded together.

An object of the present disclosure is to provide a piezoelectric actuator where the piezoelectric layer can be hard to break even though the thickness of the piezoelectric layer is small, and a method of manufacturing such a piezoelectric actuator.

A piezoelectric actuator according to a first aspect is a piezoelectric actuator for applying a pressure to a liquid in a plurality of pressure chambers, and includes: a piezoelectric layer covering the pressure chambers; a common electrode disposed on one surface of the piezoelectric layer and covering the pressure chambers; a plurality of individual electrodes disposed on the other surface of the piezoelectric layer opposite to the common electrode, and overlapping with the pressure chambers, respectively; and a plurality of metal patterns arranged in the piezoelectric layer in a direction of surface of the piezoelectric layer, neither electrically connected with each other nor to an outside.

According to the first aspect, the piezoelectric layer is reinforced by a plurality of metal patterns provided in the piezoelectric layer. Consequently, even though the thickness of the piezoelectric actuator is small, the piezoelectric layer can be hard to break. Consequently, the piezoelectric layer can be prevented from breaking at times such as when the piezoelectric actuator is handled and when the piezoelectric actuator is bonded to the flow channel unit or the like. Since no electric field occurs in a plurality of metal patterns that are neither electrically connected with each other nor to an outside (the electric field in the metal patterns is 0), the electric field occurring in the part of the piezoelectric layer sandwiched between the common electrode and the individual electrode is not influenced by the provision of the metal patterns.

ADVANTAGE OF THE INVENTION

According to the first aspect, since the piezoelectric layer is reinforced by the metal patterns provided in the piezoelectric layer, the piezoelectric layer can be hard to break even though the piezoelectric layer is thin.

The above and further objects and features will more fully be apparent from the following detailed description with accompanying drawings.

BRIEF DESCRIPTION OF THE SEVERAL VIEWS OF THE DRAWINGS

FIG. 1 is a schematic structural view of a printer according to an embodiment of the present invention;

DETAILED DESCRIPTION

Figure 2:
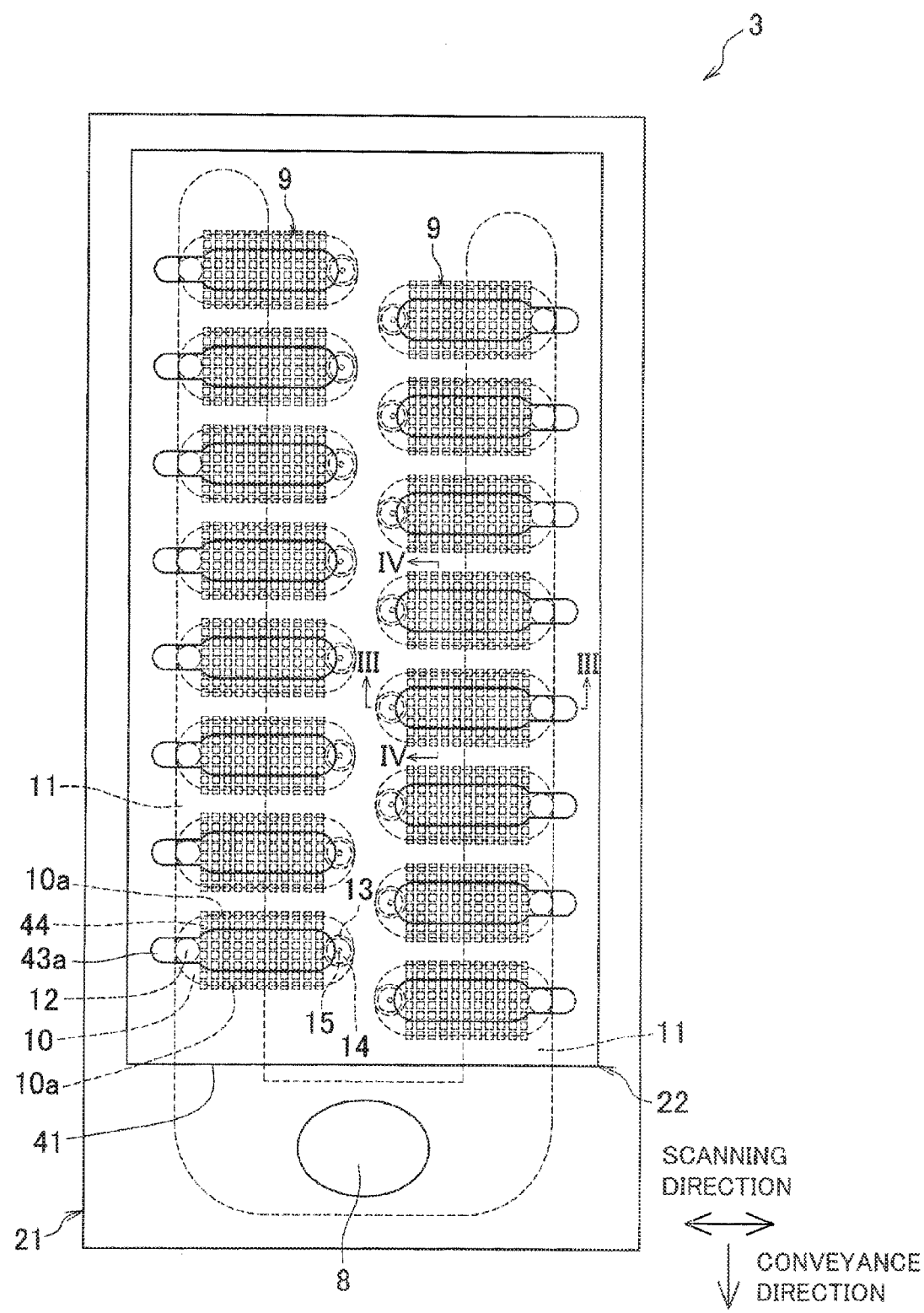
FIG. 2 is a plan view of an inkjet head of FIG. 1.

Hereinafter, a preferred embodiment will be described with reference to the drawings.

As shown in FIG. 1, a printer 1 according to the present embodiment includes a carriage 2, an inkjet head 3 and conveyance rollers 4.

The carriage 2 is supported by two guide rails 5 extending in the scanning direction, and reciprocates in the scanning direction along the guide rails 5. The inkjet head 3 is mounted on the carriage 2, and jets ink from a plurality of nozzles 15 formed on the lower surface thereof. The conveyance rollers 4 are disposed on both sides of the carriage 2 in the conveyance direction perpendicular to the scanning direction, and convey a recording sheet P in the conveyance direction.

Ink is jetted from the inkjet head 3 that reciprocates in the scanning direction together with the carriage 2 while the recording sheet P is conveyed in the conveyance direction by the conveyance rollers 4, whereby the printer 1 performs printing onto the recording sheet P.

Figure 3:
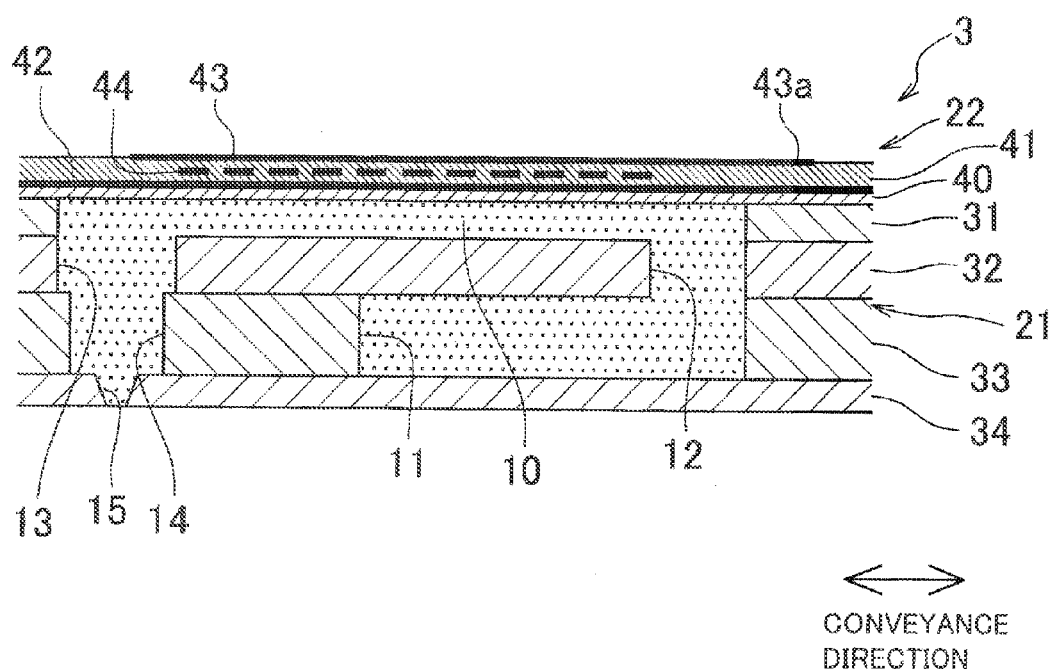
FIG. 3 is a cross-sectional view taken along line III-III of FIG. 2.
Figure 4:
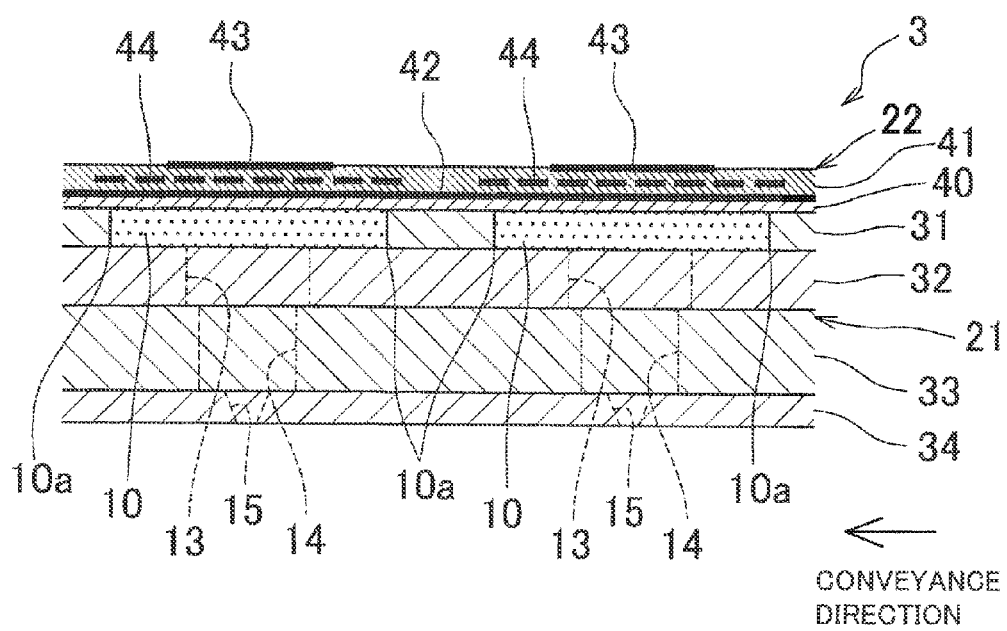
FIG. 4 is a cross-sectional view taken along line IV-IV of FIG. 2.

Next, the inkjet head 3 will be described in detail. As shown in FIGS. 2 to 4, the inkjet head 3 is provided with a flow channel unit 21 where ink channels such as the nozzles 15 and pressure chambers 10 described later are formed and a piezoelectric actuator 22 for applying a pressure to the ink in the pressure chambers 10.

The flow channel unit 21 is formed by laminating four plates 31 to 34 with one another. Of the four plates 31 to 34, the three plates 31 to 33 are made of a metal material such as stainless steel. The plate 34 is made of a synthetic resin material such as polyimide. Alternatively, the plate 34 may be made of a metal material similar to the material of the plates 31 to 33.

The plate 31 has a plurality of pressure chambers 10 formed therein. Each of the pressure chamber 10 has a substantially elliptic planar shape with the scanning direction as the major axis. The pressure chambers 10 are arranged in the conveyance direction to thereby form a pressure chamber array 9, and two pressure chamber arrays 9 disposed side by side in the scanning direction are formed on the plate 31. The pressure chambers 10 forming one pressure chamber array 9 and the pressure chambers 10 forming the other pressure chamber array 9 are arranged so as to be shifted in the conveyance direction by a length half the distance between the pressure chambers 10 in the pressure chamber arrays 9.

In the plate 32, substantially circular through holes 12 are formed in parts overlapping with the right end portions of the pressure chambers 10 forming the right side pressure chamber array 9 and the left end portions of the pressure chambers 10 forming the left side pressure chamber array 9. Moreover, in the plate 32, substantially circular through holes 13 are formed in parts overlapping with the left end portions of the pressure chambers 10 forming the right side pressure chamber array 9 and the right end portions of the pressure chambers 10 forming the left side pressure chamber array 9.

In the plate 33, two manifold, flow channels 11 are formed. The two manifold flow channels 11 extend in the conveyance direction so as to cross the pressure chambers 10 forming the pressure chamber arrays 9 and overlap with substantially the right halves of the pressure chambers 10 forming the right side pressure chamber array 9 and substantially the left halves of the pressure chambers 10 forming the left side pressure chamber array 9, respectively. Moreover, the two manifold flow channels 11 are interconnected at the end portion on the downstream side of the conveyance direction. To the two manifold flow channels 11, ink is supplied from an ink supply port 8 provided in the interconnected end portion on the downstream side of the conveyance direction.

In the plate 33, a plurality of substantially circular through holes 14 are formed in parts overlapping with the through holes 13. In the plate 34, a plurality of nozzles 15 are formed in parts overlapping with the through holes 14.

In the flow channel unit 21, the manifold flow channels 11 communicate with the pressure chambers 10 through the through holes 12, and the pressure chambers 10 communicate with the nozzles 15 through the through holes 13 and 14. As described above, a plurality of individual ink channels extending from the outlets of the manifold flow channels 11 to the nozzles 15 by way of the pressure chambers 10 are formed in the flow channel unit 21.

The piezoelectric actuator 22 includes an ink separating film 40, a piezoelectric layer 41, a common electrode 42, a plurality of individual electrodes 43 and a plurality of metal patterns 44.

The ink separating film 40 is a thin film made of an insulating material such as a synthetic resin material, is disposed on the upper surface of the flow channel unit 21, and covers the pressure chambers 10. The piezoelectric layer 41 is made of a piezoelectric material including lead zirconate titanate as a principal ingredient, which is a mixed crystal of lead titanate and lead zirconate, is disposed on the upper surface of the ink separating film 40, and covers the pressure chambers 10.

The common electrode 42 is disposed on the lower surface of the piezoelectric layer 41, extends over the entire area of the lower surface of the piezoelectric layer 41, and covers the pressure chambers 10. The common electrode 42 is connected to a non-illustrated driver IC, and held at the ground potential. In the present embodiment, since the ink separating film 40 is disposed on the lower surface of the piezoelectric layer 41, the ink in the pressure chambers 10 can be prevented from being in contact with the common electrode 42.

The individual electrodes 43 are provided for the pressure chambers 10, respectively. The individual electrodes 43 have a substantially elliptic planar shape a size smaller than the pressure chambers 10, and are disposed so as to overlap with substantially the central parts of the corresponding pressure chambers 10. The end portions of the individual electrodes 43 on the side of the through holes 12 in the scanning direction extend to parts not overlapping with the pressure chambers 10, and edge portions thereof serve as connection terminals 43a. The connection terminals 43a are connected to a non-illustrated driver IC, and, by the driver IC, either the ground potential or the driving potential (for example, approximately 20 V) is selectively applied to each individual electrode 43.

In accordance with the arrangement of the common electrode 42 and the individual electrodes 43, the parts of the piezoelectric layer 41 sandwiched between the common electrode 42 and the individual electrodes 43 are polarized along the direction of thickness of the piezoelectric layer 41.

The metal patterns 44 are disposed substantially at the center in the direction of the thickness in the piezoelectric layer 41. The metal patterns 44 are neither electrically connected with each other nor to the outside (for example, other electrodes and wiring). The metal patterns 44 each have a substantially rectangular planar shape smaller than the individual electrode 43, and are provided so as to correspond to each pressure chamber 10. Describing in more detail, the metal patterns 44 corresponding to each pressure chamber 10 are arranged in a lattice-like pattern at regular intervals in the scanning direction and in the conveyance direction in an area overlapping with the pressure chamber 10 in the piezoelectric layer 41. Of the metal patterns 44, the metal patterns 44 situated outermost in the conveyance direction are disposed so as to cross the edge 10a of the pressure chamber 10 in the conveyance direction. Moreover, of the metal patterns 44, the metal patterns 44 overlapping with a part on the central side of the pressure chamber 10 in the conveyance direction overlap with the individual electrode 43, and the other metal patterns 44 do not overlap with the individual electrode 43. It is preferable that the thickness of the piezoelectric layer 41 in the present embodiment be approximately 18 to 33 μm.

Next, a method of jetting ink from the nozzles 15 by driving the piezoelectric actuator 22 will be described. In the piezoelectric actuator 22, all the individual electrodes 43 are held at the ground potential in advance. To jet ink from a nozzle 15, the driving potential is applied to the individual electrode 43 corresponding to the nozzle 15. Then, due to the potential difference between this individual electrode 43 and the common electrode 42, an electric field along a direction the same as the direction of polarization is induced in the part of the piezoelectric layer 41 sandwiched between these electrodes. Thereby, the part of the piezoelectric layer 41 sandwiched between these electrodes contracts in the direction of surface of the piezoelectric layer 41 so that the part of the piezoelectric layer 41 which overlaps with the pressure chamber 10 is deformed so as to be convex to the side of the pressure chamber 10 as a whole. By this deformation, the volume of the pressure chamber 10 decreases to increase the pressure of the ink in the pressure chamber 10, so that ink is jetted from the nozzle 15 communicating with the pressure chamber 10.

In the present embodiment, although the metal patterns 44 are disposed between the individual electrodes 43 and the common electrode 42, the metal patterns 44 are not interconnected and are not connected to the outside. For this reason, the potential of the metal patterns 44 sandwiched between the individual electrodes 43 and the common electrode 42 is a value between the driving potential and the ground potential (for example, approximately 10 V). Moreover, since no electric field occurs (the electric field becomes 0) in metals, the electric field generated in the piezoelectric layer 41 does not change according to the presence or absence of the metal patterns 44.

Figure 5A:
FIG. 5A is a step drawing showing a step of manufacturing the inkjet head.
Figure 5B:
FIG. 5B is a step drawing showing a step of manufacturing the inkjet head.
Figure 5C:
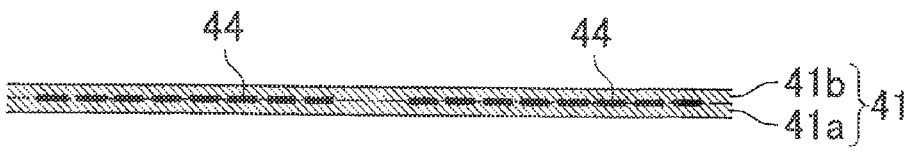
FIG. 5C is a step drawing showing a step of manufacturing the inkjet head.
Figure 5D:
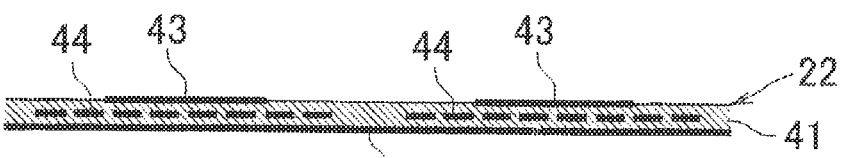
FIG. 5D is a step drawing showing a step of manufacturing the inkjet head.
Figure 5E:
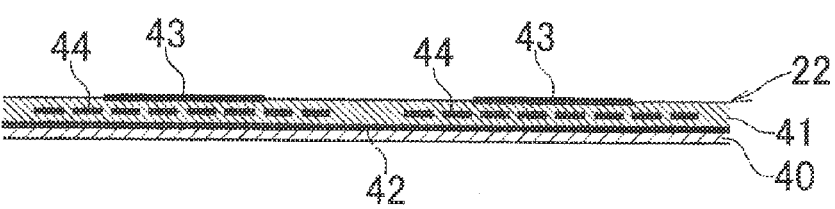
FIG. 5E is a step drawing showing a step of manufacturing the inkjet head.
Figure 5F:
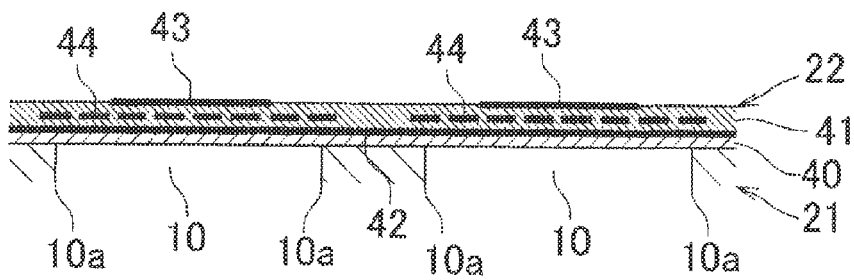
FIG. 5F is a step drawing showing a step of manufacturing the inkjet head.

Next, a method of manufacturing the inkjet head 3 will be described with reference to FIGS. 5A to 5F. To manufacture the inkjet head 3, first, as shown in FIG. 5A, a partial piezoelectric layer 41a which is substantially the lower half of the piezoelectric layer 41 ("first partial piezoelectric layer") is formed by a green sheet of a piezoelectric material ("first partial piezoelectric layer forming step"). Then, as shown in FIG. 5B, the metal patterns 44 are formed by printing or the like on the upper surface of the partial piezoelectric layer 41a ("metal pattern forming step"). Then, as shown in FIG. 5C, a green sheet of a piezoelectric material is disposed on the upper surface of the partial piezoelectric layer 41a where the metal patterns 44 are formed, whereby a partial piezoelectric layer 41b which is substantially the upper half of the piezoelectric layer 41 ("second partial piezoelectric layer") is formed on the upper surface of the partial piezoelectric layer 41a ("second partial piezoelectric layer forming step"). Then, the lamination of the partial piezoelectric layers 41a and 41b and the metal patterns 44 are fired. Thereby, the partial piezoelectric layer 41a and the partial piezoelectric layer 41b are united into the piezoelectric layer 41 in which the metal patterns 44 are disposed. Then, as shown in FIG. 5D, by printing or the like, the common electrode 42 is formed on the lower surface of the piezoelectric layer 41 ("common electrode forming step"), and the individual electrodes 43 are formed on the upper surface of the piezoelectric layer 41 ("individual electrode forming step"). Then, as shown in FIG. 5E, the ink separating film 40 is adhered to the lower surface of the piezoelectric layer 41 with an adhesive. By these steps, the piezoelectric actuator 22 is completed. Then, as shown in FIG. 5F, the piezoelectric actuator 22 and the flow channel unit 21 formed in parallel with the piezoelectric actuator 22 are bonded together with an adhesive or the like by making the individual electrodes 43 and the pressure chambers 10 in alignment with each other. Thereby, the inkjet head 3 is completed.

According to the above-described embodiment, since the piezoelectric actuator 22 has only one piezoelectric layer 41, the thickness of the piezoelectric actuator 22 can be thinner than that of the piezoelectric actuator where two or more piezoelectric layers are laminated. Consequently, the amount of deformation of the parts of the piezoelectric layer 41 that overlap with the pressure chambers 10 when the piezoelectric actuator 22 is driven can be large.

However, in the piezoelectric actuator 22 having only one piezoelectric layer 41, since the thickness is small, the piezoelectric layer 41 is subject to breakage. On the contrary, in the present embodiment, since the metal patterns 44 are formed in the piezoelectric layer 41, the piezoelectric layer 41 is reinforced by the metal patterns 44. Consequently, even though the piezoelectric actuator 22 is thin, the piezoelectric layer 41 can be hard to break.

In the piezoelectric actuator 22, although the metal patterns 44 are disposed in the parts sandwiched between the individual electrodes 43 and the common electrode 42 in the piezoelectric layer 41, as described above, the electric field generated in the piezoelectric layer 41 when the driving potential is applied to the individual electrodes 43 does not change according to the presence or absence of the metal patterns 44.

Moreover, in the present embodiment, when the piezoelectric actuators 22 are manufactured in the above-described manner, the positional relationships between the individual electrodes 43 and the metal patterns 44 can vary among the piezoelectric actuators 22. However, in the present embodiment, some of the metal patterns 44 overlapping with the pressure chambers 10 overlap with the individual electrodes 43, while the other metal patterns 44 do not overlap with the individual electrodes 43. Therefore, when the positional relationships between the individual electrodes 43 and the metal patterns 44 vary, though the overlapped areas of the individual electrodes 43 with the metal patterns 44 vary, the sum of the overlapped areas of the individual electrodes 43 with the metal patterns 44 hardly changes. Consequently, even if the positional relationships between the individual electrodes 43 and the metal patterns 44 vary, the amounts of deformation of the parts of the piezoelectric layer 41 that overlap with the pressure chambers 10 when the piezoelectric actuator 22 is driven are not likely to vary.

Moreover, in the present embodiment, when the driving potential is applied to the individual electrode 43 corresponding to one pressure chamber 10, the potential of the metal pattern 44 corresponding to the one pressure chamber 10 is a value between the driving potential and the ground potential (for example, approximately 10 V). At this time, if the metal pattern 44 overlapping with the one pressure chamber 10 also overlaps with a pressure chamber 10 adjacent to the one pressure chamber 10 unlike in the present embodiment, there is a possibility that an electric field occurs in the part of the piezoelectric layer 41 sandwiched between this metal pattern 44 and the individual electrode 43 corresponding to the adjacent pressure chamber 10 and the part of the piezoelectric layer 41 sandwiched between this metal pattern 44 and the part of the common electrode 42 overlapping with the adjacent pressure chamber 10 to unnecessarily deform the part of the piezoelectric layer 41 that overlap with the adjacent pressure chamber 10.

On the contrary, in the present embodiment, as described above, a plurality of metal patterns 44 are provided for each pressure chamber 10, and the metal pattern 44 overlapping with one pressure chamber 10 does not overlap with a pressure chamber 10 adjacent to the one pressure chamber 10. Therefore, when the part of the piezoelectric layer 41 overlapping with one pressure chamber 10 is deformed, the part of the piezoelectric layer 41 overlapping with the pressure chamber 10 adjacent to the one pressure chamber 10 is not deformed unnecessarily.

Moreover, in the manufacture of the inkjet head 3, when the flow channel unit 21 and the piezoelectric actuator 22 are bonded together, a large force is applied to the parts of the piezoelectric layer 41 which overlap with the parts of the flow channel unit 21 serving as the walls of the pressure chambers 10. For this reason, when the flow channel unit 21 and the piezoelectric actuator 22 are bonded together, a crack readily occurs in parts of the piezoelectric layer 41 in the vicinity of the edges 10a of the pressure chambers 10. On the contrary, in the present embodiment, since some of the metal patterns 44 are disposed so as to cross the edges 10a of the pressure chambers 10, when the flow channel unit 21 and the piezoelectric actuator 22 are bonded together, a crack is hard to occur in the parts of the piezoelectric layer 41 in the vicinity of the edges 10a of the pressure chambers 10.

Next, modifications of the present embodiment with various changes will be described.

Figure 6:
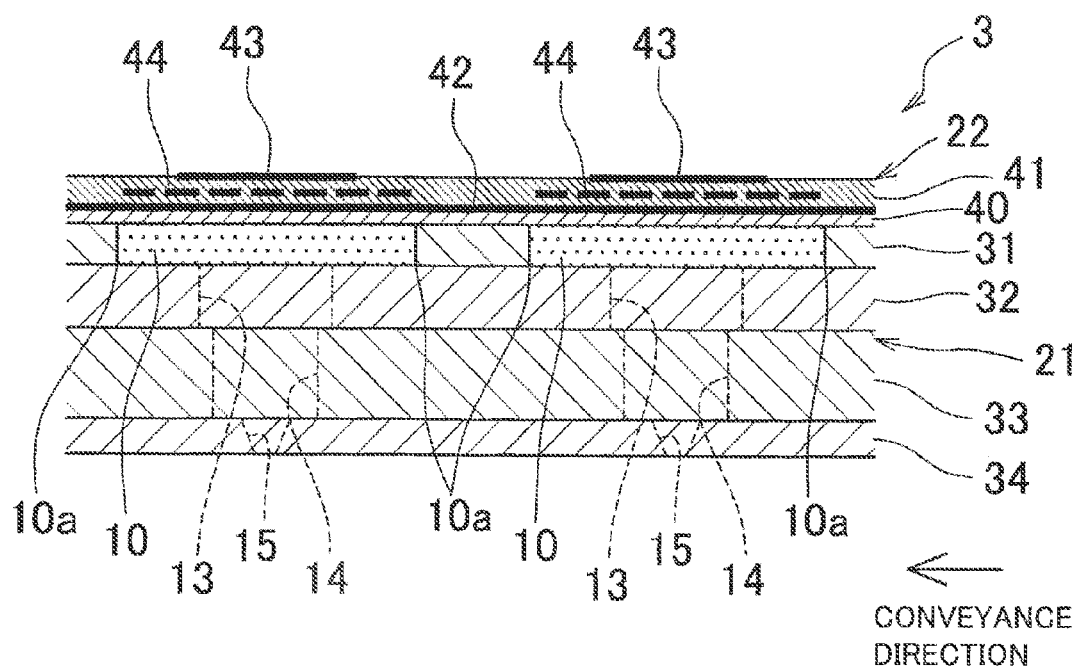
FIG. 6 is a view of a first modification corresponding to FIG. 4.

While in the above-described embodiment, some of the metal patterns 44 are disposed so as to cross the edges 10a of the pressure chambers 10, the present invention is not limited thereto. For example, a structure may be adopted in which, as shown in FIG. 6, all the metal patterns 44 are disposed only in the parts overlapping with the parts inner than the edges 10a in the piezoelectric layer 41 (first modification).

Figure 7:
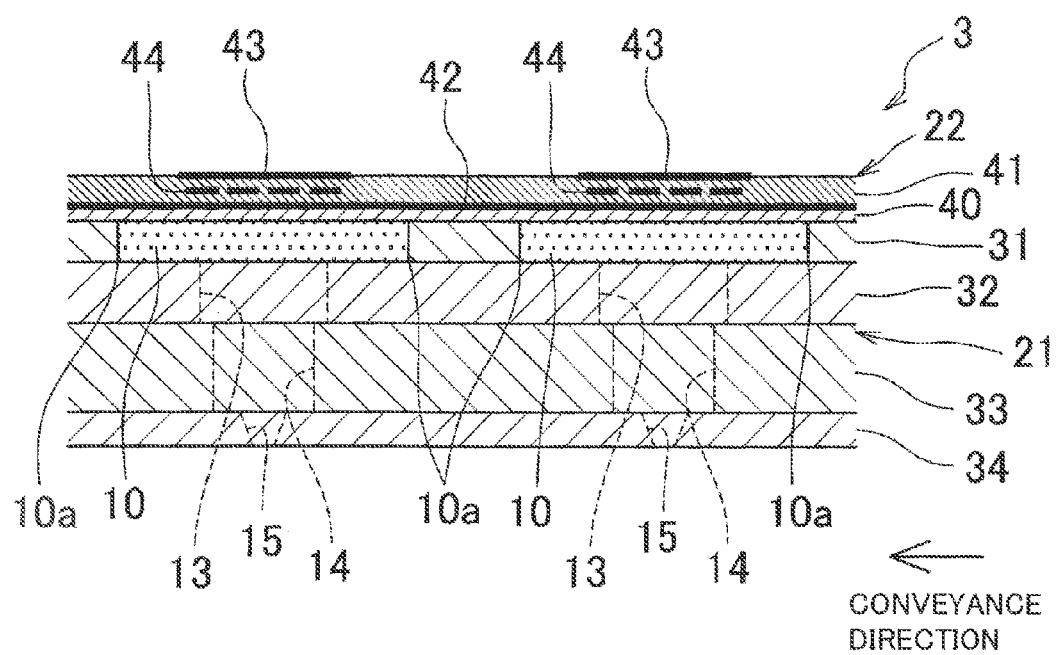
FIG. 7 is a view of a second modification corresponding to FIG. 4.

Moreover, while in the above-described embodiment, some of the metal patterns 44 that overlap with the pressure chambers 10 overlap with the individual electrodes 43 while the other metal patterns 44 do not overlap with the individual electrodes 43, the present invention is not limited thereto. For example, a structure may be adopted in which, as shown in FIG. 7, all the metal patterns 44 are disposed only in the parts, overlapping with the individual electrodes 43, of the parts overlapping with the pressure chambers 10 in the piezoelectric layer 41 (second variation).

Figure 8:
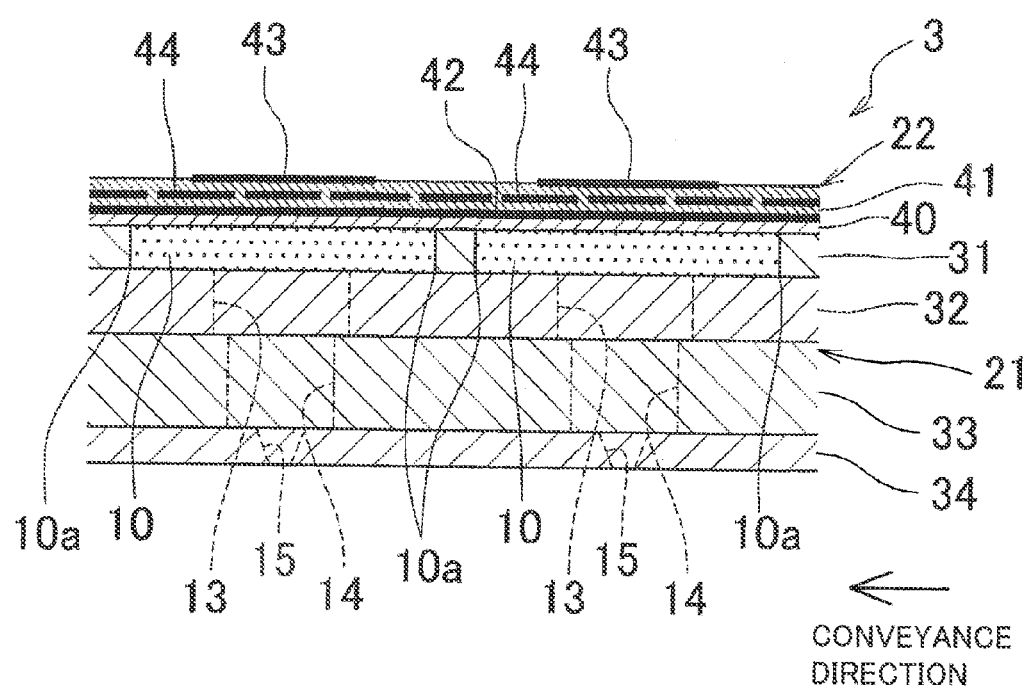
FIG. 8 is a view of a third modification corresponding to FIG. 4.

Moreover, while in the above-described, embodiment, the metal pattern 44 overlapping with one pressure chamber 10 does not overlap with a pressure chamber 10 adjacent to the one pressure chamber 10, the present invention is not limited thereto. For example, when the distance between the pressure chambers 10 is smaller than that in the above-described embodiment and the area of the metal patterns 44 is large, as shown in FIG. 8, the metal pattern 44 overlapping with the end portion of one pressure chamber 10 on the downstream side of the conveyance direction may overlap with the end portion, on the upstream side of the conveyance direction, of the pressure chamber 10 adjacent to the one pressure chamber 10 on the downstream side of the conveyance direction (third modification).

Also in this case, if the area of the part of the metal pattern 44 overlapping with two adjoining pressure chambers 10, which overlaps with the pressure chambers 10, is not so large, even though the part of the piezoelectric layer 41 overlapping with the adjoining pressure chambers 10 is deformed unnecessarily, no ink is unnecessarily jetted from the nozzles 15 communicating with the adjoining pressure chambers 10.

Figure 9:
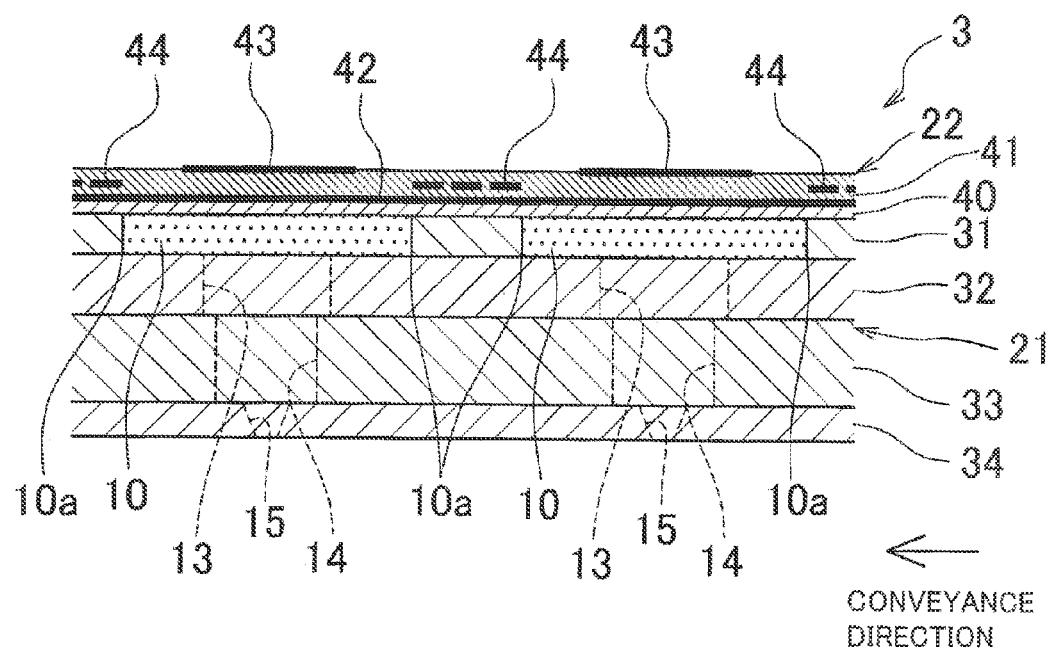
FIG. 9 is a view of a fourth modification corresponding to FIG. 4.

Moreover, while in the above-described embodiment, the metal patterns 44 are disposed so as to overlap with the pressure chambers 10, the present invention is not limited thereto. For example, a structure may be adopted in which, as shown in FIG. 9, the metal patterns 44 are provided only in the parts other than the parts overlapping with the pressure chambers 10 in the piezoelectric layer 41 such that the metal patterns 44 are disposed only in the parts overlapping with the parts serving as the walls on both sides in the conveyance direction of the pressure chambers 10 (fourth modification). In this case, since no metal patterns 44 are present in the parts of the piezoelectric layer 41 that overlap with the pressure chambers 10, the deformation of the piezoelectric layer 41 when the piezoelectric actuator 22 is driven will not be hindered by the metal patterns 44.

Moreover, the present invention is not limited to disposing the metal patterns 44 only in the parts overlapping with the pressure chambers 10 in the piezoelectric layer 41 or disposing only in the parts other than the parts of the piezoelectric layer 41 overlapping with the pressure chambers 10. For example, the metal patterns 44 may be disposed in both of the parts overlapping with the pressure chambers 10 in the piezoelectric layer 41 and the parts other than those parts, such that the metal patterns 44 are arranged in the scanning direction and in the conveyance direction over the entire area in the piezoelectric layer 41.

Moreover, while in the above-described embodiment, the metal patterns 44 are arranged in a lattice-like pattern in the scanning direction and in the conveyance direction, the present invention is not limited thereto. The metal patterns 44 may be arranged in a different direction along the direction of surface of the piezoelectric layer 41. Moreover, at this time, the present invention is not limited to arranging the metal patterns 44 in two intersecting directions, but they may be arranged only in one direction. The shape of each metal pattern 44 is not limited to a rectangle, but may be a different shape such as a circle, an ellipse or a polygon other than a rectangle. Moreover, it is unnecessary that the metal patterns 44 all have the same shape.

Moreover, while in the above-described embodiment, the common electrode 42 is disposed on the lower surface of the piezoelectric layer 41 and the individual electrodes 43 are disposed on the upper surface of the piezoelectric layer 41, the present invention is not limited thereto. A structure may be adopted in which, conversely to the above-described embodiment, the common electrode 42 is disposed on the upper surface of the piezoelectric layer 41 and the individual electrodes 43 are disposed on the lower surface of the piezoelectric layer 41.

Moreover, while an example is described above in which the present invention is applied to a piezoelectric actuator used for an inkjet head that jets ink from nozzles and the manufacturing of the piezoelectric actuator, the present invention is not limited thereto. The present invention may also be applied to a piezoelectric actuator used for a different device having a pressure chamber such as a liquid jetting device, other than the inkjet head, that jets a liquid other than ink, and the manufacturing of the piezoelectric actuator.

In the piezoelectric actuator according to the present embodiment, the metal patterns are disposed in the piezoelectric layer so as to overlap the pressure chambers.

According to the present embodiment, since a plurality of metal patterns are disposed so as to overlap the pressure chambers in the piezoelectric layer, the amount of deformation of the piezoelectric layer when a potential difference is induced between the common electrode and the individual electrodes can be made large compared with when one metal pattern is disposed so as to overlap all the pressure chambers in the piezoelectric layer.

In the piezoelectric actuator according to the present invention, some of the metal patterns are disposed in the piezoelectric layer so as to overlap with the individual electrodes and the common electrode when viewed from a direction of thickness of the piezoelectric layer, and the other metal patterns are disposed so as not to overlap with the individual electrodes.

In the manufacturing of the piezoelectric actuator, there are cases where the positional relationships between the individual electrodes and the metal patterns vary among the piezoelectric actuators. In the present embodiment, since some of the metal patterns are disposed so as to overlap with the individual electrodes and the common electrode in the piezoelectric layer and the other metal patterns are disposed so as not to overlap with the individual electrodes, even if the positional relationships between the individual electrodes and the metal patterns vary, the sum of the overlapped areas of the individual, electrodes with the metal patterns hardly changes. Consequently, the amount of deformation of the piezoelectric layer when a potential difference is induced between the individual electrodes and the common electrode can be made uniform among the piezoelectric actuators.

The piezoelectric actuator according to the present embodiment is a piezoelectric actuator for applying a pressure to the liquid in the pressure chambers aligned in a predetermined direction, and the metal patterns overlapping with one pressure chamber do not overlap with a pressure chamber adjacent to the one pressure chamber in the predetermined direction.

When a potential difference is provided between the common electrode and the individual electrode overlapping with one pressure chamber, the metal pattern overlapping with this pressure chamber is at a potential between the potential of the common electrode and the potential of the individual electrode. At this time, if this metal pattern also overlaps with another pressure chamber, there is a possibility that the part of the piezoelectric layer that overlaps with this another pressure chamber is deformed unnecessarily. In the present embodiment, a metal pattern overlapping with one pressure chamber does not overlap with another pressure chamber. Consequently, when a potential difference is provided between the common electrode and the individual electrode sandwiching one pressure chamber, the part of the piezoelectric layer that overlaps with another pressure chamber is not deformed unnecessarily.

In the piezoelectric actuator according to the present embodiment, some or all of the metal patterns cross the edge of the pressure chamber when viewed from the direction of thickness of the piezoelectric layer.

When the piezoelectric layer is bonded, for example, to the flow channel unit forming the pressure chambers, since a large force is applied to the parts of the piezoelectric layer which overlap with the parts serving as the walls of the pressure chambers, a crack readily occurs in parts of the piezoelectric layer in the vicinity of the edges of the pressure chambers. In the present embodiment, since the metal patterns are disposed so as to cross the edges of the pressure chambers, a crack can be prevented from occurring in parts of the piezoelectric layer in the vicinity of the edges of the pressure chambers.

In the piezoelectric actuator according to the present embodiment, the metal patterns are disposed in the piezoelectric layer so as not to overlap with the pressure chambers.

According to the present embodiment, since the metal patterns are disposed so as not to overlap with the pressure chambers in the piezoelectric layer, the deformation of the piezoelectric layer will not be hindered by the metal patterns.

A method of manufacturing the piezoelectric actuator according to the present embodiment includes: a first partial piezoelectric layer forming step of forming a first partial piezoelectric layer serving as a common electrode side part of the piezoelectric layer; a metal pattern forming step of forming the metal patterns on a surface of the first partial piezoelectric layer opposite to where the common electrode is disposed; a second partial piezoelectric layer forming step of forming a second partial piezoelectric layer serving as an individual electrode side part of the piezoelectric layer, on a surface, of the first partial piezoelectric layer where the metal patterns are formed, opposite to where the common electrode is disposed; a common electrode forming step of forming the common electrode on the piezoelectric layer; and an individual electrode forming step of forming the individual electrodes on the piezoelectric layer.

According to the present embodiment, a piezoelectric actuator where metal patterns are provided in the piezoelectric layer can be manufactured.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

What is claimed is:

1. A piezoelectric actuator for applying a pressure to a liquid in a plurality of pressure chambers, comprising:
   a piezoelectric layer covering the pressure chambers;
   a common electrode disposed on one surface of the piezoelectric layer and covering the pressure chambers;
   a plurality of individual electrodes disposed on the other surface of the piezoelectric layer opposite to the common electrode, and overlapping with the pressure chambers; and
   a plurality of metal patterns that are arranged inside the piezoelectric layer in a direction of surface of the piezoelectric layer, and are neither electrically connected with each other nor to the individual electrodes, each of the metal patterns being disposed between the common electrode and one of the individual electrodes in a direction of thickness of the piezoelectric layer.

2. The piezoelectric actuator according to claim 1:
   wherein the metal patterns are disposed in the piezoelectric layer so as to overlap with the pressure chambers.

3. The piezoelectric actuator according to claim 2:
   wherein some of the metal patterns are disposed in the piezoelectric layer so as to overlap with the individual electrodes and the common electrode when viewed from the direction of thickness of the piezoelectric layer, and the other metal patterns are disposed so as not to overlap with the individual electrodes.

4. The piezoelectric actuator according to claim 2, for applying the pressure to the liquid in the pressure chambers aligned in a predetermined direction:
wherein the metal patterns overlapping with one pressure chamber do not overlap with a pressure chamber adjacent to the one pressure chamber in the predetermined direction.

5. The piezoelectric actuator according to claim 3, for applying the pressure to the liquid in the pressure chambers aligned in a predetermined direction:
wherein the metal patterns overlapping with one pressure chamber do not overlap with a pressure chamber adjacent to the one pressure chamber in the predetermined direction.

6. The piezoelectric actuator according to claim 2:
wherein some or all of the metal patterns cross the edge of the pressure chamber when viewed from the direction of thickness of the piezoelectric layer.

7. The piezoelectric actuator according to claim 3:
wherein some or all of the metal patterns cross the edge of the pressure chamber when viewed from the direction of thickness of the piezoelectric layer.

8. The piezoelectric actuator according to claim 4:
wherein some or all of the metal patterns cross the edge of the pressure chamber when viewed from the direction of thickness of the piezoelectric layer.

9. The piezoelectric actuator according to claim 5:
wherein some or all of the metal patterns cross the edge of the pressure chamber when viewed from the direction of thickness of the piezoelectric layer.

10. The piezoelectric actuator according to claim 1:
wherein the metal patterns are disposed in the piezoelectric layer so as not to overlap with the pressure chambers.

11. A method of manufacturing the piezoelectric actuator according to claim 1, comprising:
a first partial piezoelectric layer forming step of forming a first partial piezoelectric layer serving as a common electrode side part of the piezoelectric layer;
a metal pattern forming step of forming the metal patterns on a surface of the first partial piezoelectric layer opposite to where the common electrode is disposed;
a second partial piezoelectric layer forming step of forming a second piezoelectric layer serving as an individual electrode side part of the piezoelectric layer, on a surface, of the first partial piezoelectric layer where the metal patterns are formed, opposite to where the common electrode is disposed; and
a common electrode forming step of forming the common electrode on the piezoelectric layer;
an individual electrode forming step of forming the individual electrodes on the piezoelectric layer.

* * * * *